United States Patent [19]

Goldman et al.

[11] 4,061,529

[45] Dec. 6, 1977

[54] METHOD FOR MAKING ETCH-RESISTANT STENCIL WITH DICHROMATE-SENSITIZED CASEIN COATING

[75] Inventors: Abraham Goldman, Kendall Park; Pabitra Datta, Cranbury, both of N.J.

[73] Assignee: RCA Corporation, New York, N.Y.

[21] Appl. No.: 772,996

[22] Filed: Feb. 28, 1977

[51] Int. Cl.² ............................................. C23F 1/02
[52] U.S. Cl. .................................... 156/644; 96/36.1; 96/114.9; 156/661; 156/904
[58] Field of Search ................ 96/36.1, 36.4, 114.7, 96/114.9; 156/644, 654–656, 659, 661, 904; 427/43, 271, 272, 282, 287

[56] References Cited

U.S. PATENT DOCUMENTS

| | | | |
|---|---|---|---|
| 3,011,890 | 12/1961 | Gates et al. | 96/114.9 X |
| 3,929,532 | 12/1975 | Kuzminski | 156/644 |

*Primary Examiner*—William A. Powell
*Attorney, Agent, or Firm*—E. M. Whitacre; G. H. Bruestle; L. Greenspan

[57] ABSTRACT

The method comprises applying to a surface to be etched a coating of a liquid composition comprising an acid-precipitated casein, alkali dichromate photosensitizer, sodium borate and water. The layer is dried, photoexposed, developed and baked to produce an etch-resistant stencil.

10 Claims, 6 Drawing Figures

METHOD FOR MAKING ETCH-RESISTANT STENCIL WITH DICHROMATE-SENSITIZED CASEIN COATING

BACKGROUND OF THE DISCLOSURE

This invention relates to a method for making an etch-resistant stencil on a metal work piece, particularly a metal sheet. The novel method may be used, for example, in a method for etching an apertured mask for use in a color television picture tube.

The preparation of apertured masks by photoexposure and etching has been described previously; for example, in U.S. Pat. Nos. 2,750,524 to F. G. Braham, 3,745,011 to D. E. Hudgin, 3,751,250 to J. J. Moscony et al, 3,834,905 to J. A. Dodd, Jr. et al, and 3,929,532 to H. W. Kuzminski. In a typical process, light-sensitive coatings are applied to both major surfaces of a thin metal sheet, such as of cold-rolled steel or a copper-nickel alloy. The coatings are exposed to light images, as by contact-printing exposure, to render the exposed portions thereof less soluble in a particular solvent. The exposed coatings are developed to remove the more-soluble unexposed portions thereof thereby producing a stencil on each surface of the sheet, and then baked to render the retained, less-soluble, exposed portions etch resistant. Then, the sheet with the etch-resistant stencil thereon is selectively etched as desired, after which the stencils are removed from the sheet.

In some prior methods, the light-sensitive coatings are comprised of dichromate-sensitized protein material, such as fish glue, albumin, and/or casein. The coatings are prepared from a liquid coating composition comprising the protein material, alkali-dichromate photosensitizer therefor and water. A layer of this aqueous coating composition is applied to the metal surface or surfaces and then dried to produce the light-sensitive coating. Where casein has been used, the liquid coating composition includes an alkalizing agent, which is an alkali compound such as $NH_4OH$, $NaOH$, $Na_2HPO_4$ and $Na_2CO_3$, in such concentration as to impart a pH of more than 7.0 to the coating composition. An alkalizing agent is added in order to render the casein therein sufficiently soluble to deposit an adequate amount of casein to produce an etch-resistant stencil. With the addition of one of the usual alkalizing agents, the light-sensitive coating is poorly adherent to the surface to be etched, and the etch-resistant stencil is weak and soft. Also, coating compositions which have pH values above 7.5 usually produce coatings with lower photosensitivity and therefore require longer exposures for producing the stencil.

SUMMARY OF THE INVENTION

In the novel method, the surface of the article to be etched is coated with a liquid coating composition which produces an improved stencil. The coating composition comprises an acid-precipitated casein as the sole sensitizable protein material, alkali dichromate photosensitizer therefor, and sodium borate as the sole alkalizing agent and water. The sodium borate is present in such concentrations that the coating composition has a pH in the range of about 6.7 to 7.3. The coating is then dried, photoexposed, developed and baked to produce an etch-resistant stencil on the surface of the article as in prior methods.

The improved dichromate-sensitized casein layers and stencils described herein result from the use, in the liquid coating composition, of the combination of (a) acid-precipitated casein as the sole sensitizable protein material and (b) sodium borate as the sole alkalizing material in such concentrations as to produce a pH of 6.7 to 7.3. Such coating compositions produce strongly adherent light-sensitive coatings. The exposed coatings may be developed with normal techniques to produce, after baking, stencils with relatively high resolution and which are strong and hard but not brittle. After the article is etched, the baked stencil may be removed with a caustic solution with little or no residue remaining on the etched surface.

DETAILED DESCRIPTION OF THE PREFERRED EMBODIMENT

Figure 1:
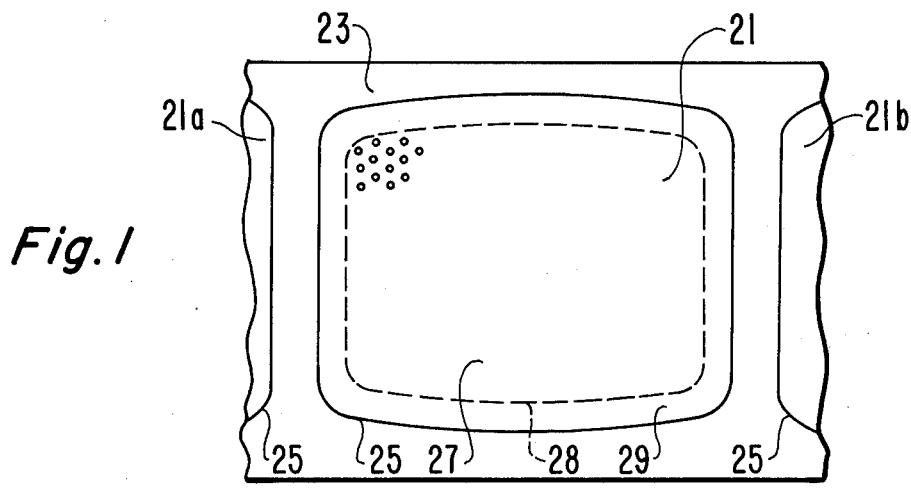
FIG. 1 is a plan view of a metal sheet after etching according to the novel method.

FIG. 1 shows a plan view of an etched apertured mask blank 21 as it emerges from the etching machine. The mask blank 21 (which is to be used in a color-television picture tube) is in a metal sheet 23 comprising a succession of such mask blanks 21a, 21 and 21b which are etched through at the margins 25 thereof except at convenient points (not indicated) sufficient to hold the mask blank 21 in place in the sheet 23. The mask blank 21 is comprised of an apertured central portion 27 defined by the broken line 28; and a skirt or peripheral portion 29 which is not apertured, although in some embodiments it may be etched partly through. This application is particularly concerned with the etch-resistant stencil used for etching the apertures in the apertured central portion 27. The apertures may be round and arranged in a hexagonal, diamond-shaped or other array. Or, the apertures may be rectangular slits arranged in vertical rows; for example, 6-mil by 30-mil slits on 30-mil centers. The apertures may be of other shapes and arrangements. In any of the embodiments, the aperture width may be uniform across the mask or may be graded in width or diameter from the center to the edge of the array as is known in the art.

The mask blank 21 is etched into a regular-carbon or a low-carbon cold-rolled-steel sheet about 4 to 10 mils in thickness. The etching may also be conducted in sheets of other materials, such as invar alloy, or a copper-nickel alloy. The sheet 23 is passed through the various operations including cleaning the sheet, producing etch-resistant stencils on the sheet, etching the sheet to produce the apertures and to define the mask blanks, and then stripping the stencils from the sheet. Subsequently, the mask blanks 21 are torn from the sheet 23. The mask blanks 21 are then heat treated (annealed), roller leveled, formed on a press, and then blackened as is known in the art, to produce masks suitable for assembly into a color-television picture tube.

Figure 2:
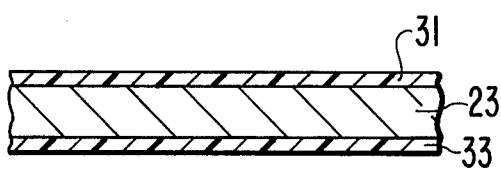
FIGS. 2 through 5 are sectional views through one aperture of a metal sheet illustrating the steps of one embodiment of the novel method.
Figure 3:
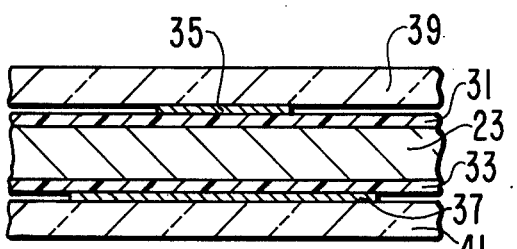

FIGS. 2 through 5 illustrate the novel method by a sequence of steps that may be used in making a round aperture in the central portion 27 of a hexagonal array of apertures in a 6-mil-thick strip of low-carbon cold-rolled steel, as shown in FIG. 1. The sheet 23 is coated on both major surfaces with one of the liquid coating compositions set forth below. The coatings are dried in air, producing light-sensitive coatings 31 and 33 of dichromate-sensitized casein, as shown in FIG. 2. After the coatings have dried, the coated strip is positioned in a chase, such as is shown in U.S. Pat. No. 3,751,250 to J. J. Moscony et al, between two light-opaque master patterns; one master pattern 35 for the coating 31 on the one major surface of the sheet 23; and the other master pattern 37 for the other coating 23 on the other major surface of the sheet 23, as shown in FIG. 3. The light-opaque patterns may be of chromium or nickel metal coated on the inner surfaces of glass plates 39 and 41 respectively so that the patterns physically contact the coatings 31 and 33. The one master pattern 35 has a circular shape about 5 mils in outside diameter. The other master pattern 37 has a circular shape about 16 mils in diameter. Center lines of the one and the other master patterns are coincident, but may be offset from one another if desired.

With the patterns 35 and 37 positioned as shown in FIG. 3, the coatings 31 and 33 on each of the surfaces of the sheet 23 are now exposed to hardening radiation, as from a carbon-arc source, or xenon radiation lamp, which radiation passes through the glass plates 39 and 41 incident on the coatings 31 and 33. The radiation insolubilizes the coatings 31 and 33 except where the one and the other master patterns 35 and 37 shadow the coatings. When the coatings are suitably exposed, the exposure is stopped, and the master patterns are removed.

Figure 4:
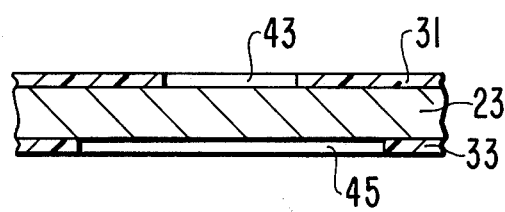

The coatings 31 and 33 are now developed as by flushing with water or other solvent to remove the unexposed, more-soluble, shadowed portions of the coatings 31 and 33. As shown in FIG. 4, after development, the sheet 23 carries on its one major surface a stencil comprising a coating 31 having a first circular opening 43 therein and, on its other major surface, a stencil comprising a coating 33 having a second circular opening 45 therein. The stencil coatings 31 and 33 with the openings 43 and 45 therein are now baked in air at about 260° to 350° C to develop better etch-resistance in the coatings.

Figure 5:
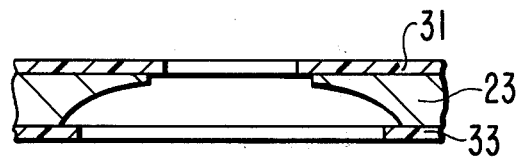

The sheet 23 with the etch-resistant stencils thereon is now selectively etched from both sides thereof in a single step or in successive steps to produce the desired aperture. FIG. 5 shows the stencil-coated sheet 23 at the end of etching. The etching is conducted in the usual manner employing a ferric-chloride hydrochloric-acid liquid etchant. Controlled amounts of chlorine gas are fed into the etchant to maintain its etching strength.

After the etching has been completed, the coated sheet 23 is washed with water to remove any residual etchant. Then, the etch-resistant stencils 31 and 33 are removed from the sheet 23, as by spraying thereon an aqueous solution of sodium hydroxide maintained at temperatures of about 50° to 80° C. After removing the stencils, the sheet 23 is washed in water and dried.

In a comparative study, the following liquid coating compositions in grams were used to compare the novel method (Group A) with prior methods (Groups B and C):

| Test Groups: | A | | | B | | | C | | |
|---|---|---|---|---|---|---|---|---|---|
| Coating Compositions | #1 | #2 | #3 | #4 | #5 | #6 | #7 | #8 | #9 |
| Casein | 66 | 66 | 66 | 0 | 0 | 0 | 0 | 0 | 0 |
| Sodium Caseinate | 0 | 0 | 0 | 66 | 66 | 66 | 66 | 66 | 66 |
| Sodium Borate (Anhydrous) | 10 | 12 | 23 | 4.4 | 4.4 | 4.4 | 8.5 | 11.2 | 17.1 |
| Ammonium Dichromate | 6.6 | 9.9 | 16.5 | 6.6 | 9.9 | 16.5 | 6.6 | 9.9 | 16.5 |
| Surfactant | 1 | 1 | 1 | 1 | 1 | 1 | 1 | 1 | 1 |
| Deionized Water | 920 | 920 | 920 | 920 | 920 | 920 | 920 | 920 | 920 |
| pH | 7.3 | 7.3 | 7.1 | 6.7 | 6.6 | 6.4 | 7.0 | 7.1 | 7.3 |

Additional compositions with lower pH down to about 6.7 may be provided by reducing the content of sodium borate in any one of compositions #1, #2 and #3.

Mixing Instructions

1. Heat the deionized water to about 50° to 60° C, then dissolve therein the anhydrous sodium borate $Na_2B_4O_7$ and the surfactant. Hydrated sodium borate (borax) may be substituted for anhydrous sodium borate, but the weight must be adjusted to allow for the hydration. The surfactant may be Igepal marketed by GAF Corporation, New York, N.Y.

2. To the solution of borate and surfactant, add the casein or sodium caseinate in a steady stream with vigorous agitation of the solution. After all of the casein or sodium caseinate has been added and dissolved, cool the solution to room temperature and then measure the visocsity.

3. Just before usage, add the ammonium dichromate, which will lower the pH of the solution to about the indicated pH.

Performance

The foregoing Group A coating compositions contain an acid-precipitated casein as the sole photosensitizable protein material as specified in the novel method. There was no significant difference in light sensitivity among Compositions #1, #2 and #3. The Groups B and C compositions contain sodium caseinate instead of casein in similar compositions. The Group A compositions were superior to Groups B and C compositions in at least the following respects:

1. Pot Life — Compositions #1, #2 and #3 were usable after storage of more than two weeks, whereas Compositions #4 to #9 were not usable after less than three days of storage, having reacted or cured in the absence of light. There was no significant difference in pot life among Compositions #1, #2 and #3.

Figure 6:
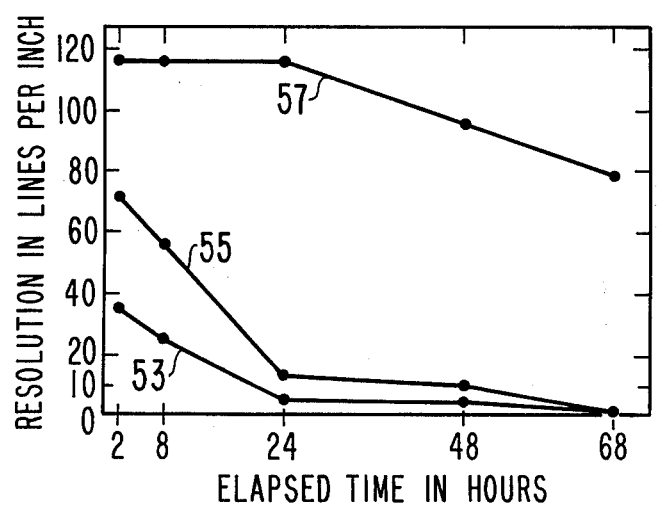
FIG. 6 is a family of curves illustrating the improved shelf life of the photosensitive coatings in one embodiment of the invention.

2. Shelf Life — The dry photosensitized coatings produced by the Group A compositions remained substantially unchanged for at least 24 hours and, after 3 days, were superior to coatings made with fresh batches of the Groups B and C compositions. Shelf life was measured by the resolution in line pairs per inch achieved when preparing the stencil. FIG. 6 complies data which shows the superior shelf life of coatings made with Composition #2 (curve 51) over the shelf life of coatings made with Compositions #5 (curve 53) and #8 (curve 55). There was no significant difference in resolution among dry coatings made from Compositions #1, #2 and #3. Also, there was no significant difference in resolution among dry coatings made from Compositions #4, #5 and #6, and from Compositions #7, #8 and #9.

3. Dichromate Crystallization — Compositions #1, #2 and #3 showed no tendency towards producing small dichromate crystals in the dry coatings, whereas Compositions #6 and #9 frequently showed this defect. The presence of small dichromate crystals in the dry coating usually results in spurious etching of the metal sheet in areas that should be masked by the stencil.

GENERAL CONSIDERATIONS

We have studied casein-containing coating compositions which employ sodium borate as the sole alkalizing material and similar compositions in which sodium borate was replaced in whole or in part by one or more of NaOH, $NA_4OH$, $Na_2HPO_4$, and $Na_2CO_3$ at pH in the range of 7.0 to 8.0 We observed that coating compositions containing casein with NaOH, $NH_4OH$ and $Na_2CO_3$ had poor pot life, and the coatings produced had poor shelf life. Coating compositions containing casein with $Na_2HPO_4$ had somewhat better pot life, and the coatings produced had fair shelf life but were too soft and were poorly adhered to the surface to be etched.

It is our belief that the improved performances of the coating compositions and the coatings of the novel method are the result of using acid-precipitated casein as the sole sensitizable protein and a dichromate photosensitizer in combination with sodium borate as the sole alkalizing material in such proportions as to produce a pH of about 6.7 to 7.3 in the liquid coating composition. It is our belief that other alkalizing materials unnecessarily degrade the casein, causing the coating composition to be unstable. Also, we believe that sodium borate retards the formation of intermediate species $HCrO_4^-$ in the dark by a complex formation with $HB_4O_7^-$, thereby reducing the speed of the dark reaction; that is, the curing of the composition in the absence of light.

In the coating composition used in the novel method, several factors are important:

1. Any acid-precipitated casein may be used. Casein, being a natural product, differs in characteristics from various sources. Also, the manner in which casein is isolated may make a difference in its behavior toward the same chemical reagents. Thus, caseins which are isolated by precipitation with lactic acid, nitric acid and hydrochloric acid differ in their response to various alkalizing materials. The use of sodium borate as the sole alkalizing agent as described above permits the use of any of the acid-precipitated caseins in the novel method with the realization of the advantages of the novel method. Generally, the casein comprises about 4 to 12 weight percent of the liquid coating composition. The caseins used in the novel method are acidic and insoluble in water and are different from alkali caseinates, which are alkaline and soluble in water. When the caseins used herein are dissolved in solutions of sodium borate, the product differs from alkali caseinates as evidenced by the differences in the characteristics of the coatings produced.

2. The pH of the coating composition must fall between about 6.7 and 7.3. The increased pH is achieved solely by the addition of sodium borate. The pH may not be lower than about 6.7 or higher than about 7.3, or the sensitivity or thickness of the coating will be substantially reduced. Specific gravity of the coating composition determines in part the thickness of the coating. The lower the specific gravity, the thinner the coating. Also, the higher the temperature in the coating chamber, the thinner the coating produced. Specific gravities of 1.028 to 1.036 produce suitable coatings between about 40 and 200 microinches thick.

3. Among sodium, potassium, and ammonium dichromate sensitizers, ammonium dichromate is preferred because it imparts greater sensitivity to the coatings. The exposure times of ammonium-dichromate-sensitizer casein coatings are equivalent to those of ammonium-dichromate-sensitized fish-glue coatings. The sensitizer comprises about 0.05 (5%) to 0.30 (30%) of the weight of casein present.

4. The surfactant, which aids in producing the coating composition, may be selected from a large group of available dispersing agents. Some suitable dispersing agents are Igepal marketed by GAF Corporation, New York, N.Y., Triton DF-18 marketed by Rohm and Haas, Philadelphia, Pa., and Sulframin 4010 marketed by Witco Chemical Co., New York, N.Y. A bactericide is not required but may be included if desired. Some suitable bactericides are phenol and Dowicide G-ST marketed by Dow Chemical Co., Midland, Mich.

5. The use of borox (sodium borate decahydrate) or anhydrous sodium borate as the sole alkalizing material in the coating composition permits faster and more satisfactory processing. When sodium borate is partly or entirely replaced with another alkalizing material, the coating may be poorly developed. To overcome this problem, slower line speeds and higher developing temperatures may be necessary. The sodium borate comprises about 0.05 to 0.20, and preferably 0.10 to 0.18, of the weight of the casein present in the coating composition. Above 0.20 (20%), the viscosity of the coating composition is disturbed and is not easily controlled, which makes difficult the control of the dry coating thickness. Above 0.20, the pH of the coating composition is above 7.3 and cannot be lowered without the addition of more alkali dichromate or some acid. Below 0.05 (5%), spurious deposits of nodules high in iron and/or chromium may form on the metal surface, which nodules interfere with both the photoexposure and etching steps.

6. Coating thicknesses on the metal sheet are an important parameter in mask manufacturing. If the resist is too thin, under 40 microinches, the etching will be non-uniform and cause mask defects. If the resist is too thick, over 200 microinches, the result will be longer exposure times, mechanical problems of abrasion sticking, pump-down problems and poor mask uniformity.

7. The preferred bake-in temperature for imparting etch resistance to a developed casein coating must be in the range of 260° C to 350° C. Casein coatings baked at lower temperatures are most efficiently removed in the caustic wash after etching. Generally, the higher the temperature of the etchant used, the higher should be the baking temperature for the developed coating.

We claim:

1. A method for producing an etch-resistant stencil upon a surface comprising applying to said surface a coating of a liquid composition comprising
   i. acid precipitated casein, as the sole sensitizable protein material in said liquid composition,
   ii. alkali dichromate photosensitizer for said casein, iii. sodium borate, as the sole alkalizing agent in said liquid composition, iv. and water, drying said coating, photoexposing said dry coating to a light image, developing said exposed coating to produce said stencil, and then baking said stencil in air to render said stencil etch resistant.

2. The method defined in claim 1 wherein said sodium borate being present in such proportions as to produce a pH of about 6.7 to 7.3 in said liquid composition.

3. The method defined in claim 1 wherein said sodium borate comprises about 0.05 to 0.20 of the weight of said casein.

4. The method defined in claim 1 wherein said casein is lactic-acid precipitated casein.

5. The method defined in claim 1 wherein said casein is hydrochloric acid precipitated casein.

6. In a method for producing an apertured mask for a cathode-ray tube, the steps comprising a. applying to each major surface of a metal sheet a coating of a liquid, water-based coating composition having a pH of about 6.7 to 7.3 and consisting essentially of i. acid-precipitated casein as the sole photosensitizable protein material present, ii. alkali dichromate photosensitizer for said casein, iii. anhydrous sodium borate, as the sole alkalizing agent in said coating composition, said sodium borate comprising about 0.05 to 0.20 of the weight of said casein, iv. and water, b. drying said coatings, c. exposing said dry coatings to light images, d. developing said exposed coatings to produce stencils on each of said major surfaces, e. baking said stencils in air to render said stencils etch resistant, f. and then applying an etchant for said metal sheet to both of said surfaces until said sheet is etched a desired amount.

7. The method defined in claim 6 wherein said photosensitizer comprises 0.05 to 0.30 of the weight of said casein.

8. The method defined in claim 6 wherein said stencil is baked in air at about 260° to 350° C.

9. The method defined in claim 6 wherein said sheet is of cold-rolled steel and said etchant includes ferric chloride.

10. The method defined in claim 6 wherein said sodium borate comprises about 0.10 to 0.18 of the weight of said casein.

* * * * *